United States Patent
Motohara

(10) Patent No.: US 9,625,664 B2
(45) Date of Patent: Apr. 18, 2017

(54) PHOTOELECTRIC CONVERSION MODULE AND OPTICAL TRANSMISSION UNIT

(71) Applicant: OLYMPUS CORPORATION, Tokyo (JP)

(72) Inventor: Hiroyuki Motohara, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 181 days.

(21) Appl. No.: 14/466,246

(22) Filed: Aug. 22, 2014

(65) Prior Publication Data

US 2014/0361153 A1   Dec. 11, 2014

Related U.S. Application Data

(63) Continuation of application No. PCT/JP2013/052391, filed on Feb. 1, 2013.

(30) Foreign Application Priority Data

Feb. 28, 2012   (JP) .................. 2012-042058

(51) Int. Cl.
G02B 6/36   (2006.01)
G02B 6/42   (2006.01)
(Continued)

(52) U.S. Cl.
CPC .......... *G02B 6/4245* (2013.01); *G01J 1/0219* (2013.01); *G01J 1/0425* (2013.01);
(Continued)

(58) Field of Classification Search
CPC .................................... G02B 6/4202
(Continued)

(56) References Cited

U.S. PATENT DOCUMENTS

| 5,247,596 A | 9/1993 | Maignan et al. |
| 5,774,616 A | 6/1998 | Matsuda |

(Continued)

FOREIGN PATENT DOCUMENTS

| EP | 0400896 A2 | 12/1990 |
| JP | 03-012613 | 1/1991 |

(Continued)

OTHER PUBLICATIONS

International Search Report dated Apr. 2, 2013 issued in PCT/JP2013/052391.

*Primary Examiner* — Thanh Luu

(74) *Attorney, Agent, or Firm* — Scully, Scott, Murphy & Presser, P.C.

(57) ABSTRACT

A photoelectric conversion module includes: a substrate having a wiring layer and a through hole; a photoelectric conversion element having a light emitting unit or light receiving unit and mounted on the substrate such that the light emitting unit or light receiving unit faces the through hole; a protruding portion that has a hole portion communicating with the through hole, and protrudes from one of principal surfaces of one of the substrate and the photoelectric conversion element, one of the principal surfaces facing the other one of the substrate and the photoelectric conversion element; and an adhesive that is filled in a part of a region between the substrate and the photoelectric conversion element, the region being a region outside an inner peripheral surface of the hole portion, and that bonds the substrate to the photoelectric conversion element.

8 Claims, 9 Drawing Sheets

(51) Int. Cl.
*G01J 1/02* (2006.01)
*G01J 1/04* (2006.01)
*H01S 5/022* (2006.01)
*H01S 5/183* (2006.01)

(52) U.S. Cl.
CPC ......... *G02B 6/4202* (2013.01); *G02B 6/4239* (2013.01); *G02B 6/4253* (2013.01); *G02B 6/4257* (2013.01); *H01S 5/0224* (2013.01); *H01S 5/02284* (2013.01); *H01S 5/02228* (2013.01); *H01S 5/02272* (2013.01); *H01S 5/183* (2013.01)

(58) Field of Classification Search
USPC .................................. 250/227.11; 385/88–94
See application file for complete search history.

(56) References Cited

U.S. PATENT DOCUMENTS

| | | | |
|---|---|---|---|
| 6,623,178 B1 * | 9/2003 | Sakurai | G02B 6/4201 385/88 |
| 7,714,369 B2 | 5/2010 | Okumura et al. | |
| 2010/0184247 A1 | 7/2010 | Okumura et al. | |
| 2011/0194820 A1 | 8/2011 | Sakurai et al. | |
| 2014/0097459 A1 | 4/2014 | Motohara | |

FOREIGN PATENT DOCUMENTS

| | | |
|---|---|---|
| JP | 04-361211 A | 12/1992 |
| JP | 09-015459 | 1/1997 |
| JP | 11-121653 A | 4/1999 |
| JP | 2001-250889 A | 9/2001 |
| JP | 2003-046096 A | 2/2003 |
| JP | 2003-140008 A | 5/2003 |
| JP | 2003-209332 A | 7/2003 |
| JP | 2004-258528 A | 9/2004 |
| JP | 2004-317627 A | 11/2004 |
| JP | 2005-268567 A | 9/2005 |
| JP | 2005-286284 A | 10/2005 |
| JP | 2007-103555 A | 4/2007 |
| JP | 2008-182026 A | 8/2008 |
| JP | 2009-047937 A | 3/2009 |
| JP | 2009-251224 A | 10/2009 |
| WO | WO 2013/011983 A1 | 1/2013 |

* cited by examiner

PHOTOELECTRIC CONVERSION MODULE AND OPTICAL TRANSMISSION UNIT

CROSS REFERENCES TO RELATED APPLICATIONS

This application is a continuation of PCT international application Ser. No. PCT/JP2013/052391 filed on Feb. 1, 2013 which designates the United States, incorporated herein by reference, and which claims the benefit of priority from Japanese Patent Application No. 2012-042058, filed on Feb. 28, 2012, incorporated herein by reference.

BACKGROUND

1. Technical Field

The disclosure relates to a photoelectric conversion module including a photoelectric conversion element for performing conversion between an optical signal and an electric signal, and to an optical transmission unit including the photoelectric conversion module.

2. Related Art

Conventionally, in an optical transmission unit, which includes an optical fiber and an electric conversion element having a light receiving unit or light emitting unit, various means for improving an optical coupling rate between the photoelectric conversion element and optical fiber have been made. For example, in Japanese Patent Application Laid-open No. 2009-47937, a technique is disclosed, in which an optical fiber is inserted through a through hole formed in a substrate having an optical conversion element mounted thereon and is fixed by an adhesive, and a light emitting unit of a light emitting element (LD element) is positioned and mounted opposite to an end face of the optical fiber. In this technique, in order to improve a bonding strength between the photoelectric conversion element and the substrate, an adhesive made of a resin or the like may be filled in between the substrate and the photoelectric conversion element.

SUMMARY

In accordance with some embodiments, a photoelectric conversion module and an optical transmission unit are presented.

In some embodiments, a photoelectric conversion module includes: a substrate having a wiring layer and a through hole; a photoelectric conversion element having a light emitting unit or light receiving unit and mounted on the substrate such that the light emitting unit or light receiving unit faces the through hole; a protruding portion that has a hole portion communicating with the through hole and protrudes from one of principal surfaces of one of the substrate and the photoelectric conversion element, the one of the principal surfaces facing the other one of the substrate and the photoelectric conversion element; and an adhesive that is filled in a part of a region between the substrate and the photoelectric conversion element, the region being a region outside an inner peripheral surface of the hole portion, in order to bond the substrate to the photoelectric conversion element. The adhesive is filled by injection along a direction towards a center of the through hole from an end portion of the substrate. At least a part of an upstream portion of an outer edge of the protruding portion becomes gradually wider along the direction, the upstream portion being upstream of the center of the through hole in the direction, and a part of a downstream portion of the outer edge of the protruding portion is positioned outside a mounting area of the photoelectric conversion element projected on a principal surface of the substrate, the downstream portion being downstream of the center of the through hole in the direction.

In some embodiments, an optical transmission unit includes: the above described photoelectric conversion module; and an optical fiber with one of end faces thereof facing the light emitting unit or the light receiving unit in a three dimensional region including the through hole and extending along a central axis of the through hole.

The above and other features, advantages and technical and industrial significance of this invention will be better understood by reading the following detailed description of presently preferred embodiments of the invention, when considered in connection with the accompanying drawings.

DETAILED DESCRIPTION

Hereinafter, with reference to the appended drawings, modes for carrying out the invention (hereinafter, referred to as "embodiments") will be described. The drawings referred to in the description below are schematic, and when the same object is illustrated in different drawings, its dimensions and scalings may be presented differently.

First Embodiment

Figure 1:
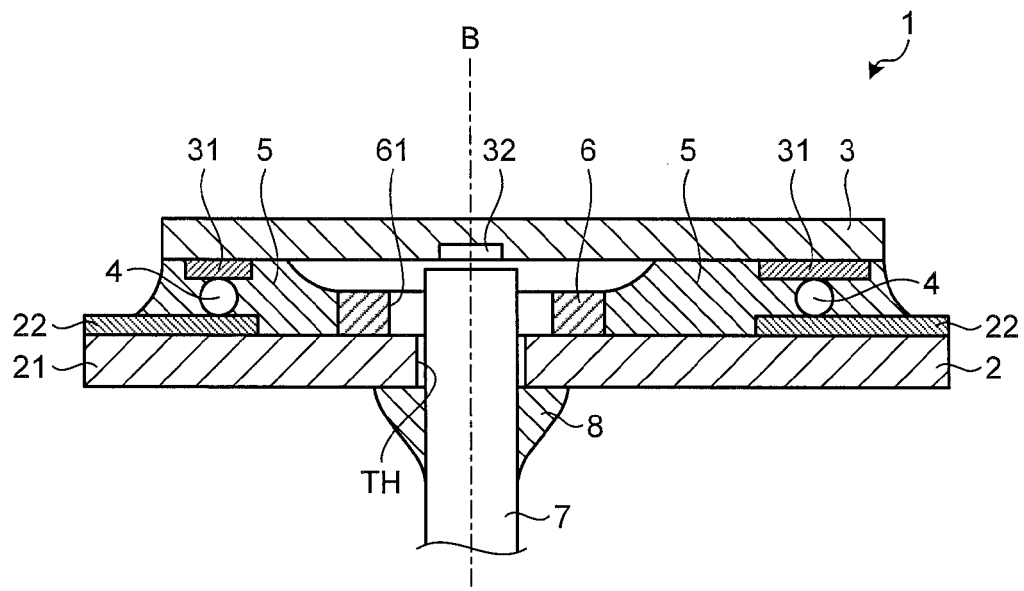
FIG. 1 is a cross section diagram illustrating a configuration of main parts of an optical transmission unit according to a first embodiment of the present invention.

FIG. 1 is a cross section diagram illustrating a configuration of main parts of an optical transmission unit according to a first embodiment of the present invention. An optical transmission unit 1 illustrated in the figure includes: a substrate 2, which is plate-like and has a through hole TH formed therein and penetrating in a plate thickness direction; a surface light emitting laser 3, which is mounted on the substrate 2 and is a photoelectric conversion element that converts an electric signal into an optical signal and performs emission; a bump 4 which connects an electrode of the substrate 2 with an electrode of the surface light emitting laser 3; an adhesive 5, which is filled in a part of a region between the substrate 2 and surface light emitting laser 3 and connects between these; a protruding portion 6 which protrudes from a principal surface facing the surface light emitting laser 3, the principal surface being one of principal surfaces of the substrate 2; an optical fiber 7 which has one end portion inserted in the through hole TH and transmits light emitted by the surface light emitting laser 3; and an adhesive 8 which bonds the optical fiber 7 inserted through the through hole TH to the substrate 2. Of structural elements of the optical transmission unit 1, structural elements other than the optical fiber 7 and adhesive 8 constitute a photoelectric conversion element module according to the first embodiment.

Figure 2:
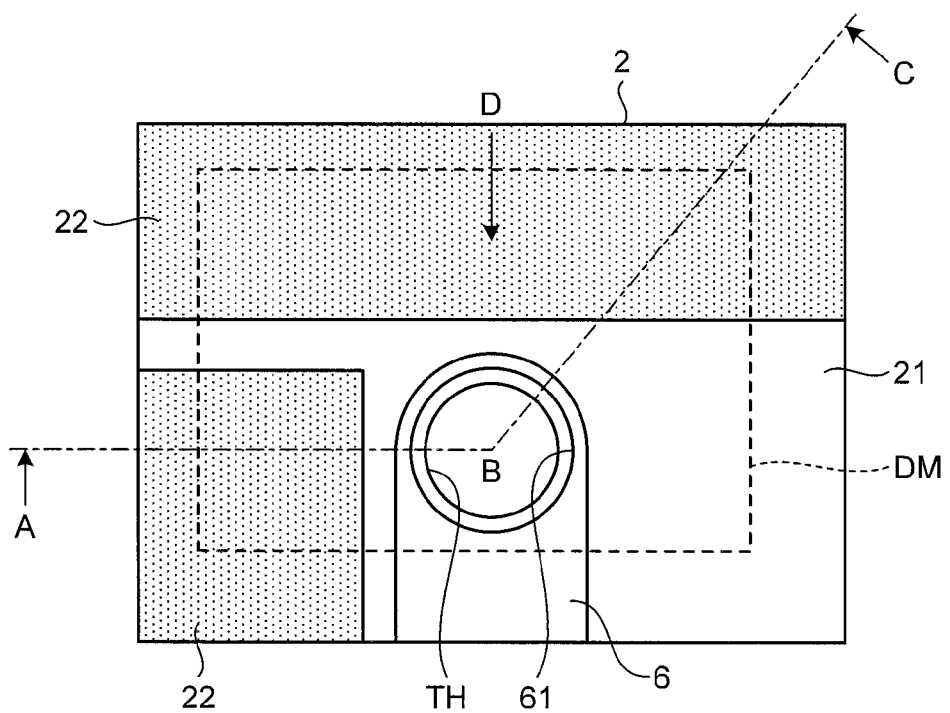
FIG. 2 is a diagram illustrating a configuration of one of principal surfaces of a substrate of the optical transmission unit according to the first embodiment of the present invention, the one of the principal surfaces of the substrate facing a surface light emitting laser.

FIG. 2 is a diagram illustrating a configuration of one of principal surfaces of the substrate 2, which faces the surface light emitting laser 3 (a top surface side of the substrate 2 in FIG. 1), the principal surface being one of the principal surfaces of the substrate 2. An A-B-C line illustrated in FIG. 2 illustrates a cutting plane of FIG. 1. That is, FIG. 1 is a combined cross section diagram along the A-B-C line of FIG. 2. The substrate 2 has: a base portion 21, which is plate shaped and has an insulating material as a base material thereof; and a wiring layer 22, which is provided on a principal surface of the base portion 21 and forms a path of the electric signal. The wiring layer 22 is formed in a region where the through hole TH and the protruding portion 6 are not formed. The wiring layer 22 is configured by using a metal, such as gold (Au) or copper (Cu). A rectangular broken-lined area DM illustrates an area, which is an area that has been projected on the principal surface of the substrate 2, the area being an area over which the surface light emitting laser 3 is overlapped with the substrate 2 (hereinafter, referred to as "mounting area DM"). The substrate 2 is an FPC substrate, a ceramic substrate, or the like.

Figure 3:
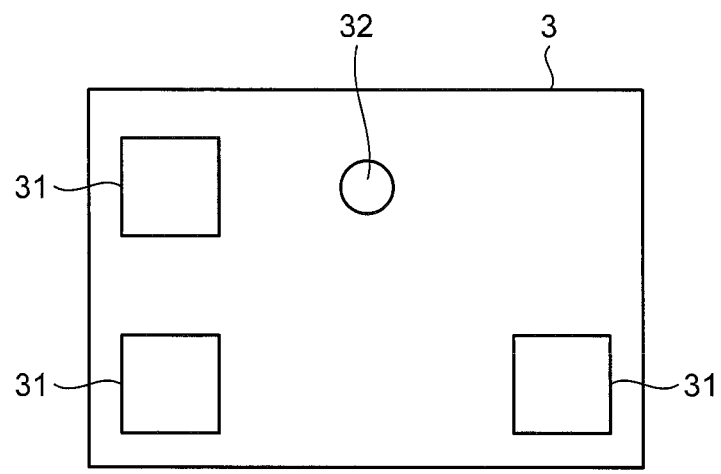
FIG. 3 is a diagram illustrating a configuration of one of principal surfaces of the surface light emitting laser of the optical transmission unit according to the first embodiment of the present invention, the one of the principal surfaces of the surface light emitting laser facing the substrate.

FIG. 3 is a diagram illustrating a configuration of one of principal surfaces of the surface light emitting laser 3, which faces the substrate 2 (lower surface side of the surface light emitting laser 3 in FIG. 1). The surface light emitting laser 3 has: an electrode 31, which connects via the bump 4 to an electrode (not illustrated) included in the wiring layer 22 of the substrate 2; and a light emitting unit 32, which converts an electric signal to an optical signal and emits light. The surface light emitting laser 3 is flip-chip mounted such that the light emitting unit 32 faces an end face of the optical fiber 7 inserted through the through hole of the substrate 2. Positioning between the light emitting unit 32 and the end face of the optical fiber 7 upon manufacture of the optical transmission unit 1 is performed by using, for example, a two-field optical system. The surface light emitting laser 3 transmits data by the light emitting unit 32 blinking according to an electric signal sent from the substrate 2.

The bump 4 is made of gold or a gold alloy, for example. When joining the substrate 2 and the surface light emitting laser 3, after forming the bump 4 on the electrode 31 of the surface light emitting laser 3, the bump 4 is placed on a specified electrode of the substrate 2 and ultrasonic bonding is performed.

As the bump 4, a solder bump may be applied. In that case, by a reflow method or the like, a solder may be melted for join.

The adhesives 5 and 8 are made of, for example, an underfill material or a sidefill material, which is made of a thermosetting resin or an ultraviolet curing resin. The adhesive 5 is filled in a gap, which is a region between the substrate 2 and the surface light emitting laser 3 and is at an outer peripheral side of the protruding portion 6.

The protruding portion 6 is formed so as to surround a periphery of the through hole TH from the principal surface opposite to the surface light emitting laser 3, the principal surface being one of the principal surfaces of the substrate 2. The protruding portion 6 is provided in a region from inside the mounting area DM of the surface light emitting laser 3 up to one side of the substrate 2. An outer edge of a principal surface of the protruding portion 6 is in a shape joined of: a rectangle; and a semicircle having a diameter equal to a length of a side of the rectangle. This semi-circular shape is none other than a shape that gradually widens along a short side direction (up and down direction in FIG. 2) of the substrate 2. At an approximate central portion of the substrate 2, the outer edge of the principal surface of the protruding portion 6 is semi-circular arc shaped.

In the protruding portion 6, a hole portion 61, which communicates with the through hole TH and penetrates in a thickness direction of the protruding portion 6, is formed. The hole portion 61 has a central axis, which matches that of the through hole TH, and has a diameter larger than a diameter of the through hole TH. The protruding portion 6 is formed of a resist, for example. The hole portion 61 and the through hole TH only need to communicate with each other, and the central axes thereof may not match each other.

A size of the protruding portion 6 and a height thereof from the principal surface of the substrate 2 are set according to various conditions, such as a ratio thereof with respect to an area of the mounting area DM, a type or injection amount of the adhesive 5, and a required bonding strength.

A distal end portion of the optical fiber 7 is inserted through the through hole TH and the hole portion 61 of the protruding portion 6. The optical fiber 7 is adhesively fixed to the substrate 2 by the adhesive 8 on a principal surface side which does not face the surface light emitting laser 3, the principal surface being one of the principal surfaces of the substrate 2. At another end portion thereof not illustrated, the optical fiber 7 connects to the photoelectric conversion element module including the photoelectric conversion element, such as a photodiode that receives an optical signal transmitted by the optical fiber 7 and converts the optical signal to an electric signal.

A position of the end face of the optical fiber 7 is not limited to a position illustrated in FIG. 1. For example, a distance between the end face of the optical fiber 7 and the light emitting unit 32 may be made larger than that illustrated in FIG. 1 and the end face may be positioned at the principal surface side (lower surface side in FIG. 1) of the substrate 2 not facing the surface light emitting laser 3. In this case, the optical fiber 7 may be held by an optical fiber holding member that is fixed to the substrate 2. In this sense, one end face of the optical fiber 7 just needs to be arranged so as to be opposite to the surface light emitting laser 3 in a three dimensional region, which includes the through hole TH of the substrate 2 and extends along the central axis of the through hole TH.

When the optical transmission unit 1 having the above configuration is manufactured, a direction in which the adhesive 5 is injected after joining the surface light emitting laser 3 to the substrate 2, from a gap therebetween, is a direction toward a center of the through hole TH from an end portion of the substrate 2 on a side opposite to the protruding portion 6 (in an arrow "D" direction in FIG. 2).

When the adhesive 5 is injected along this injection direction, because the outer edge of the protruding portion 6 becomes gradually wider along the arrow "D" direction, the adhesive 5 spreads in the mounting area DM along the outer edge of the protruding portion 6 and reaches an end portion of the substrate 2 along the rectangular outer edge of the protruding portion 6. Therefore, the protruding portion 6 functions as an obstacle when the adhesive 5 flows and the adhesive 5 does not flow into the hole portion 61 and the through hole TH.

In addition, the adhesive 5 does not join together by going around behind the protruding portion 6 as seen from an upstream side of the injection direction. Accordingly, occurrence of a flaw is able to be prevented, such as uneven adhesion that is caused when the adhesive 5 that has been branched off by the obstacle at the upstream side of the injection direction and has flowed downstream joins together at a downstream side of that obstacle.

According to the above described first embodiment of the present invention, a photoelectric conversion module includes: a protruding portion that has a hole portion communicating with a through hole of a substrate and protrudes from one of principal surfaces of one of the substrate and a photoelectric conversion element (surface light emitting laser), one of the principal surfaces facing the other one of the substrate and the photoelectric conversion element; and an adhesive that is filled in a part of a region between the substrate and the photoelectric conversion element, the region being a region outside an inner edge of the protruding portion, in order to bond the substrate to the photoelectric conversion element. With this structure, the adhesive cannot reach inside the through hole. Therefore, a bonding strength between a photoelectric conversion element and a substrate, on which the photoelectric conversion element is mounted, is able to be improved and a decrease in optical coupling rate between the photoelectric conversion element and an optical fiber is able to be prevented.

Further, according to the first embodiment, since the protruding portion is formed on the substrate from the mounting area up to a portion outside the mounting area, occurrence of a flaw, such as uneven adhesion, is able to be prevented. As a result, according to the first embodiment, a variation in optical coupling rate between a photoelectric conversion element and an optical fiber among respective products is also able to be suppressed.

In the first embodiment, the configuration of the protruding portion is not limited to the one described above. Hereinafter, configurations of protruding portions of optical transmission units according to modified examples of the first embodiment will be described.

Figure 4:
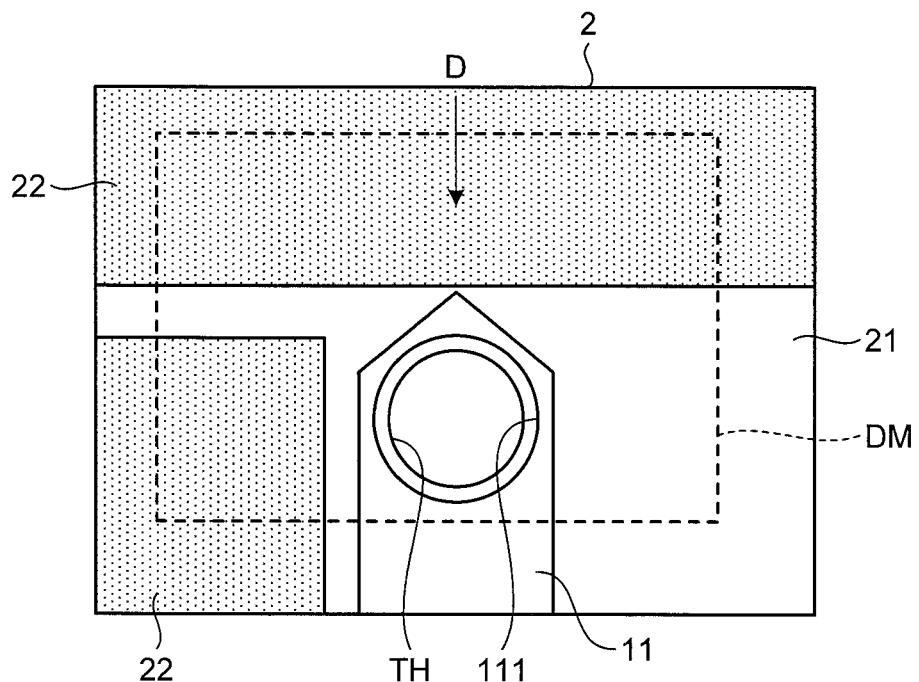
FIG. 4 is a diagram illustrating a configuration of a protruding portion of an optical transmission unit according to a first modified example of the first embodiment of the present invention.

FIG. 4 is a diagram illustrating a configuration of a protruding portion of an optical transmission unit of a first modified example of the first embodiment, and is a diagram illustrating a configuration of one of principal surfaces of the substrate 2, which faces the surface light emitting laser 3. An outer edge of a principal surface of a protruding portion 11 illustrated in FIG. 4, the principal surface being at an approximate center portion of the substrate 2, is approximately V-shaped. A vertex of the V-shape is positioned on a straight line, which is in the injection direction of the adhesive 5 and joins an injection position of the adhesive 5 and the center of the through hole TH. Further, the approximate V-shape is none other than a shape that gradually widens along a short side direction of the substrate 2 (the injection direction of the adhesive 5). Furthermore, the protruding portion 11 has a hole portion 111 formed therein, the hole portion 111 having a central axis that matches that of the through hole TH and having a diameter larger than a diameter of the through hole TH.

According to the first modified example, by injecting the adhesive 5 in a direction towards the protruding portion 11 from the end portion of the substrate 2 opposite to the vertex of the approximate V-shape of the protruding portion 11 (in the arrow "D" direction in FIG. 4), similarly to the protruding portion 6 of the first embodiment, the adhesive 5 is able to be infallibly prevented from flowing into the hole portion 111 and through hole TH and occurrence of a flaw, such as uneven adhesion, is able to be prevented.

In the first modified example, the approximately V-shaped slope may be made step-shaped or curve-shaped.

Figure 5:
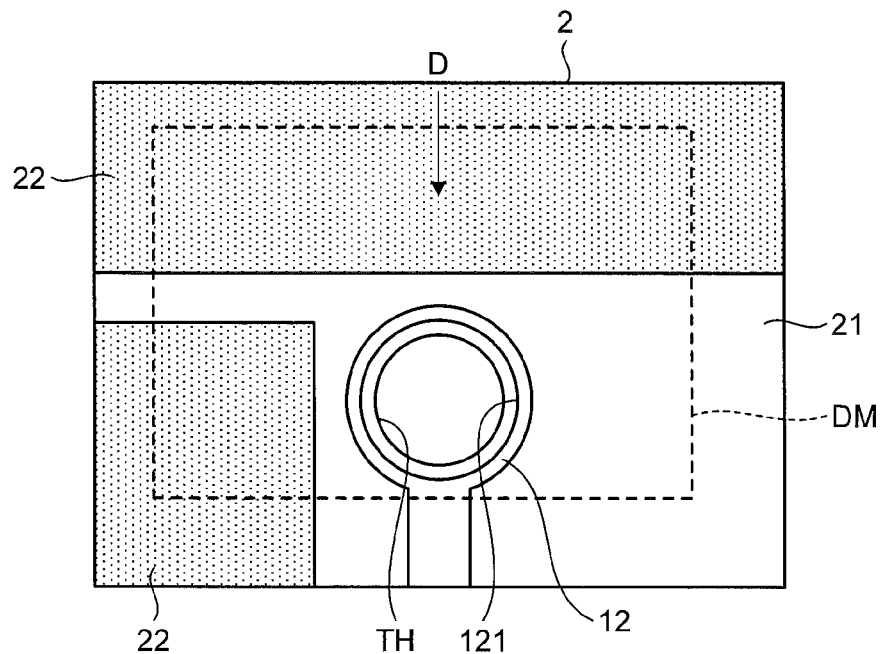
FIG. 5 is a diagram illustrating a configuration of a protruding portion of an optical transmission unit according to a second modified example of the first embodiment of the present invention.

FIG. 5 is a diagram illustrating a configuration of a protruding portion of an optical transmission unit according to a second modified example of the first embodiment, and is a diagram illustrating a configuration of one of principal surfaces of the substrate 2, which faces the surface light emitting laser 3. An outer edge of a principal surface of a protruding portion 12 illustrated in FIG. 5 is in a shape joined of: a circle arranged in the mounting area DM; and an approximate rectangle continuing from this circle and extending up to an end portion of the substrate 2. Further, the protruding portion 12 has a hole portion 121 formed therein, the hole portion 121 having a central axis that matches that of the through hole TH and having a diameter larger than the diameter of the through hole TH.

According to the second modified example, the adhesive 5 does not join together by going around a back side of the protruding portion 12 as seen from an upstream side of the injection direction (the arrow "D" direction in FIG. 5). Therefore, occurrence of a flaw, such as uneven adhesion, is able to be prevented.

Figure 6:
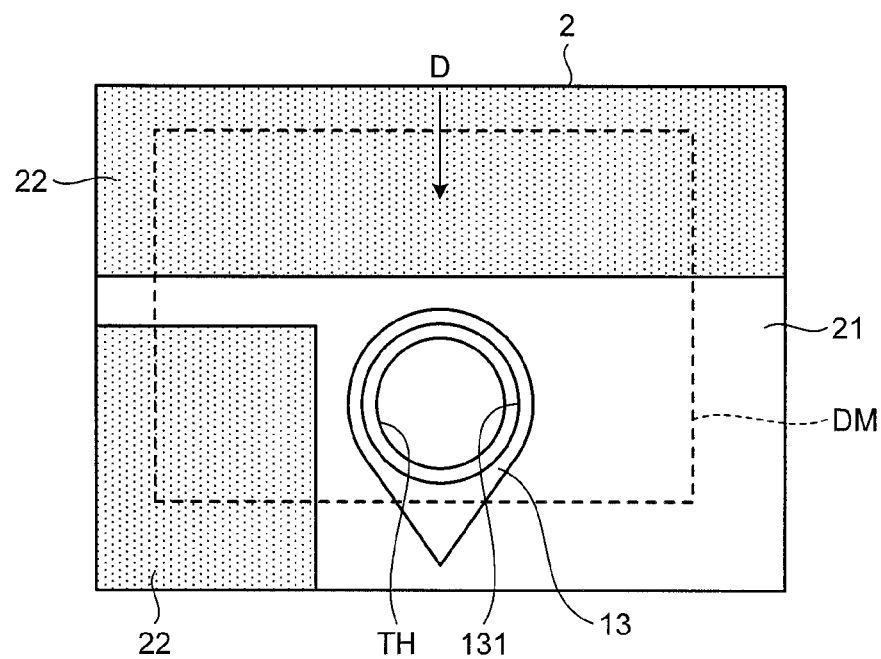
FIG. 6 is a diagram illustrating a configuration of a protruding portion of an optical transmission unit according to a third modified example of the first embodiment of the present invention.

FIG. 6 is a diagram illustrating a configuration of a protruding portion of an optical transmission unit according to a third modified example of the first embodiment, and is a diagram illustrating a configuration of one of principal surfaces of the substrate 2, which faces the surface light emitting laser 3. An outer edge of a principal surface of a protruding portion 13 illustrated in FIG. 6 is formed in a shape joined of: a circular arc arranged in the mounting area DM; and a triangle having two sides that reach near the end portion of the substrate 2, the two sides being formed by two tangents touching the circular arc. Further, the protruding portion 13 has a hole portion 131 formed therein, the hole portion 131 having a central axis that matches that of the through hole TH and having a diameter larger than the diameter of the through hole TH.

According to the third modified example, since the adhesive 5 does not join together by going around a back side of the protruding portion 13 at least in the mounting area DM as seen from an upstream side of the injection direction (the arrow "D" direction in FIG. 6), occurrence of a flaw, such as uneven adhesion, is able to be prevented.

Figure 7:
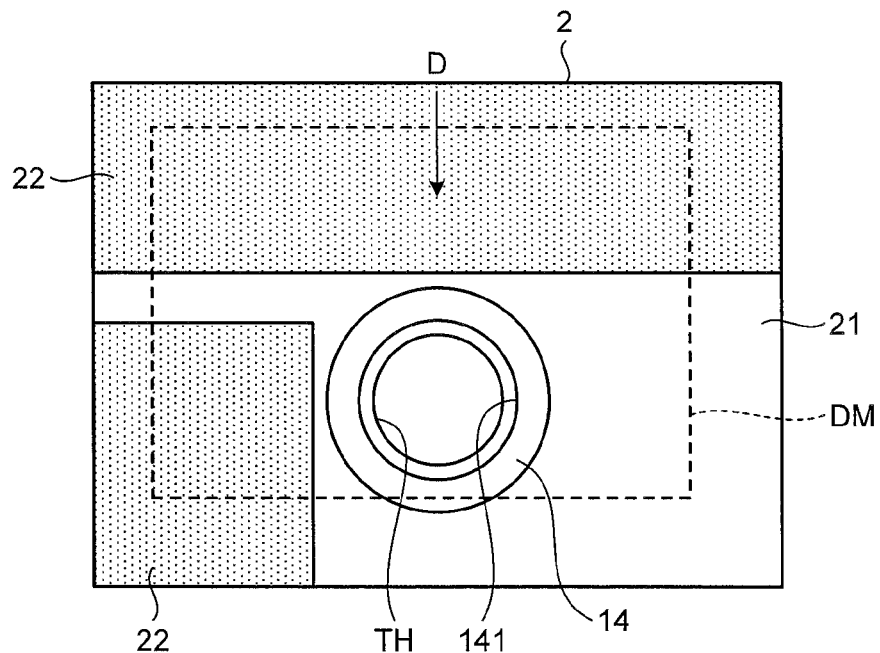
FIG. 7 is a diagram illustrating a configuration of a protruding portion of an optical transmission unit according to a fourth modified example of the first embodiment of the present invention.

FIG. 7 is a diagram illustrating a configuration of a protruding portion of an optical transmission unit according to a fourth modified example of the first embodiment, and is a diagram illustrating a configuration of one of principal surfaces of the substrate 2, which faces the surface light emitting laser 3. An outer edge of a principal surface of a protruding portion 14 illustrated in FIG. 7 forms a circular shape having a center inside the mounting area DM and a part thereof is positioned outside the mounting area DM. The center of this circle matches the center of the through hole TH. Further, in the protruding portion 14, a hole portion 141 is formed, which has a center that matches a center of a circle forming the outer edge and has a diameter larger than the diameter of the through hole TH.

According to the fourth modified example, there is a possibility that the adhesive 5 may go around a back side (downstream side) of the protruding portion 14 with respect to the injection direction (the arrow "D" direction in FIG. 7), but this back side is outside the mounting area DM of the surface light emitting laser 3, and thus no influence is exerted on adhesion between the substrate 2 and the surface light emitting laser 3. Therefore, occurrence of a flaw, such as uneven adhesion, is able to be prevented.

Figure 8:
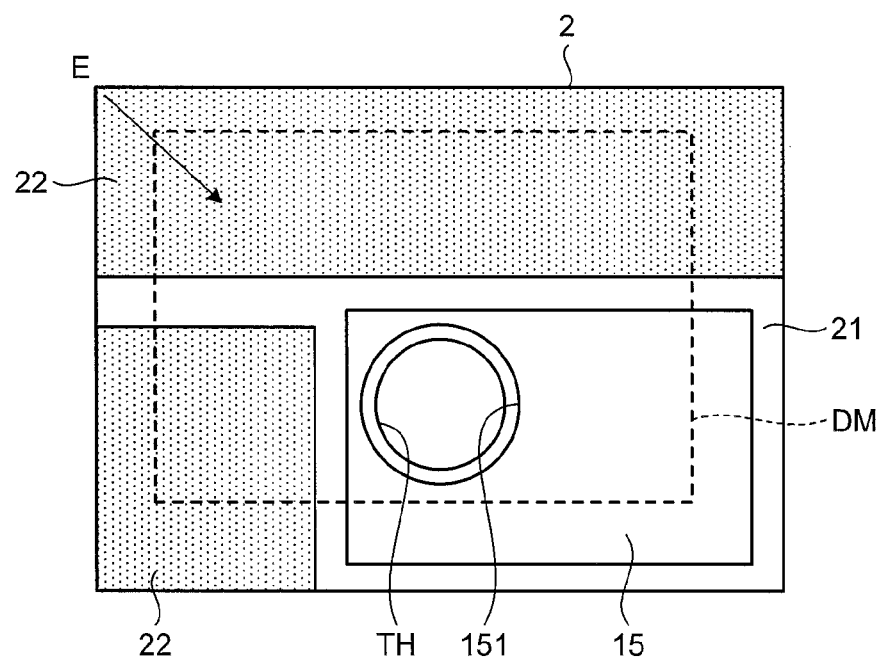
FIG. 8 is a diagram illustrating a configuration of a protruding portion of an optical transmission unit according to a fifth modified example of the first embodiment of the present invention.

FIG. 8 is a diagram illustrating a configuration of a protruding portion of an optical transmission unit according to a fifth modified example of the first embodiment, and is a diagram illustrating a configuration of one of principal surfaces of the substrate 2, which faces the surface light emitting laser 3. An outer edge of a principal surface of a protruding portion 15 illustrate in FIG. 8 is rectangular. Each side of this rectangle is arranged parallel to any of sides of a rectangle forming a boundary of the mounting area DM. A part of each of two adjacent sides of the rectangle forming the outer edge of the principal surface of the protruding portion 15 is positioned in the mounting area DM, while the remaining two sides are positioned outside the mounting area DM. Accordingly, of vertices of the rectangle forming the outer edge of the principal surface of the protruding portion 15, only one vertex is positioned inside the mounting area DM. Further, the protruding portion 15 has a hole portion 151 formed therein, the hole portion 151 having a central axis that matches that of the through hole TH and having a diameter larger than the diameter of the through hole TH.

In the fifth modified example, the direction, in which the adhesive 5 is injected when bonding the substrate 2 to the surface light emitting laser 3, is a direction approximately parallel to a diagonal line of the rectangle forming the outer edge of the principal surface of the protruding portion 15 and a direction towards the vertex, which is the vertex of the protruding portion 15 and which is positioned inside the mounting area DM. Specifically, in the case illustrated in FIG. 8, the adhesive 5 is injected from near a left upper end portion of the substrate 2 (in an arrow "E" direction in FIG. 8). In this sense, the protruding portion 15 is in a shape that gradually widens along the injection direction of the adhesive 5.

According to the fifth modified example, the adhesive 5 is able to be infallibly prevented from flowing into the hole portion 151 and through hole TH and occurrence of a flaw, such as uneven adhesion, is able to be prevented.

Second Embodiment

Figure 9:
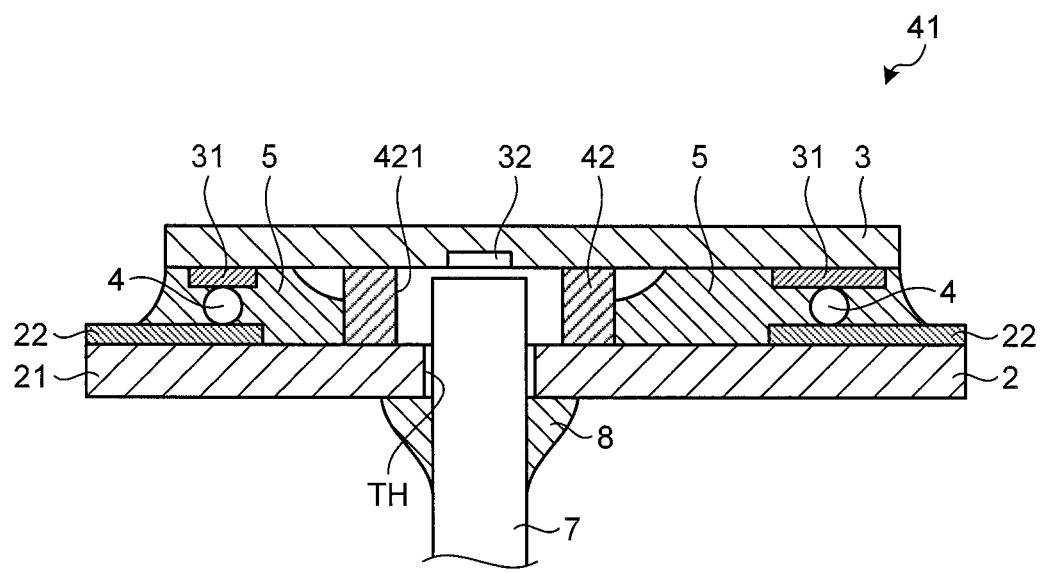
FIG. 9 is a cross section diagram illustrating a configuration of main parts of an optical transmission unit according to a second embodiment of the present invention.

FIG. 9 is a cross section diagram illustrating a configuration of main parts of an optical transmission unit according to a second embodiment of the present invention, and is a cross section diagram corresponding to FIG. 1 in the first embodiment. An optical transmission unit 41 illustrated in FIG. 9 has a configuration similar to that of the optical transmission unit 1 described in the first embodiment, except for a configuration of a protruding portion thereof.

A protruding portion 42 is provided on a principal surface of the substrate 2 and a top end surface (principal surface) thereof abuts against a principal surface of the surface light emitting laser 3. Further, the protruding portion 42 has a hole portion 421 formed therein, the hole portion 421 having a central axis that matches that of the through hole TH and having a diameter larger than the diameter of the through hole TH. A shape of the principal surface of the protruding portion 42 is, for example, similar to any of the protruding portions 6 and 11 to 15 described in the first embodiment. This protruding portion 42 is realized by adjusting beforehand a height of the protruding portion 42 based on an interval upon mounting between the substrate 2 and surface light emitting laser 3.

According to the above described second embodiment of the present invention, similarly to the above described first embodiment, a bonding strength between a photoelectric conversion element (surface light emitting laser) and a substrate, on which the photoelectric conversion element is mounted, is able to be improved, and a decrease in optical coupling rate between the photoelectric conversion element and an optical fiber is able to be prevented. Further, a variation in the optical coupling rate between the photoelectric conversion element and optical fiber among respective products is able to be suppressed.

Moreover, according to the second embodiment, since in the gap between the substrate and photoelectric conversion element, the protruding portion completely surrounds a portion communicating with the through hole, the adhesive is able to be even more infallibly prevented from flowing into the through hole. Therefore, this is particularly suitable for a case in which an adhesive having a low viscosity is used.

Figure 10:
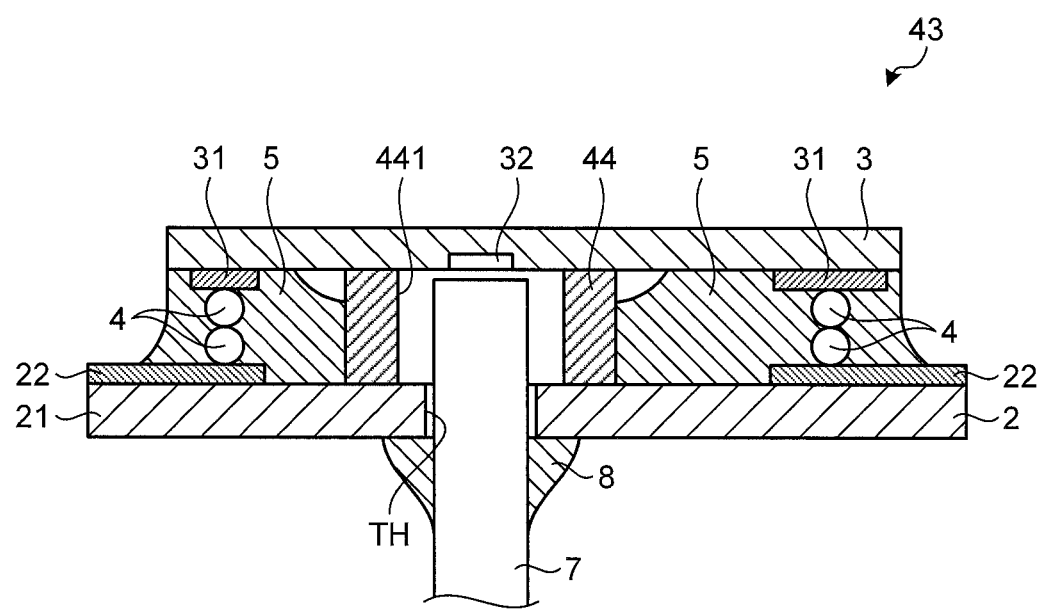
FIG. 10 is a cross section diagram illustrating a configuration of main parts of an optical transmission unit according to a modified example of the second embodiment of the present invention.

FIG. 10 is a cross section diagram illustrating a configuration of main parts of an optical transmission unit according to a modified example of the second embodiment. In an optical transmission unit 43 illustrated in this figure, the feature that a top end surface (principal surface) of a protruding portion 44 is abutted against the principal surface of the surface light emitting laser 3 is the same as that of the second embodiment. Further, in this modified example, by overlapping the bumps 4 in two stages, a position of the surface light emitting laser 3 is made to correspond to a height of the protruding portion 44. Furthermore, the protruding portion 44 has a hole portion 441 formed therein, the hole portion 441 having a central axis that matches that of the through hole TH and having a diameter larger than the diameter of the through hole TH.

According to the modified example of the second embodiment, if it is difficult to adjust the height of the protruding portion 44, by changing the number of stages of the bumps 4, the height is able to be adjusted.

Of course, the number of stages of the bumps 4 in this modified example is not limited to two, and according to the height of the protruding portion 44, that number may be modified as appropriate.

Third Embodiment

Figure 11:
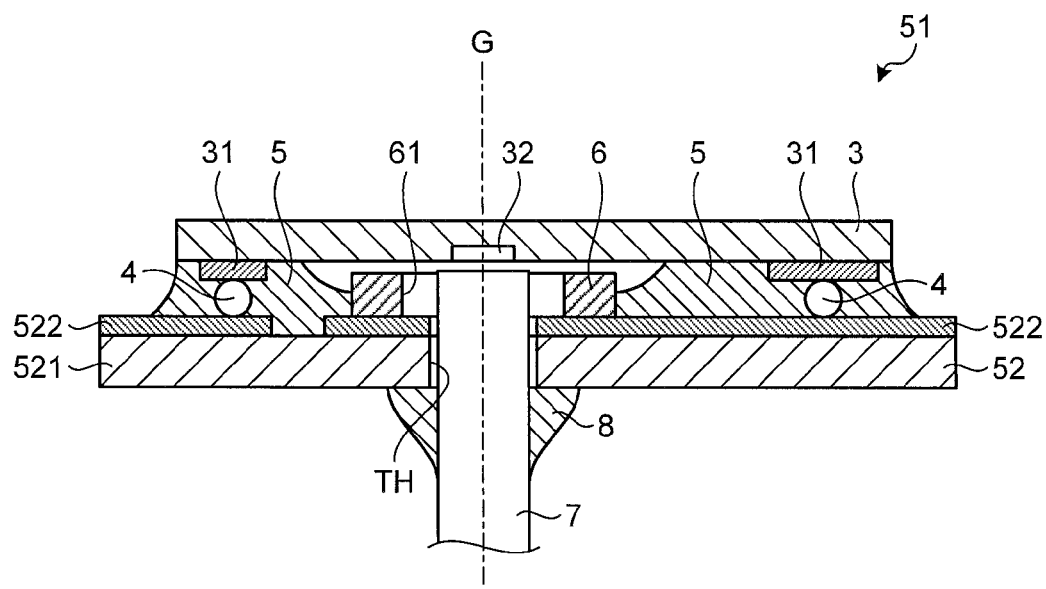
FIG. 11 is a cross section diagram illustrating a configuration of main parts of an optical transmission unit according to a third embodiment of the present invention.

FIG. 11 is a cross section diagram illustrating a configuration of main parts of an optical transmission unit according to a third embodiment of the present invention. An optical transmission unit 51 illustrated in this figure includes: a substrate 52, which is plate shaped and has a through hole TH formed therein, the through hole TH penetrating in a plate thickness direction thereof; a surface light emitting laser 3 that is mounted on the substrate 52; a bump 4 that connects an electrode of the substrate 52 with the electrode of the surface light emitting laser 3; an adhesive 5 which is filled in a part of a region between the substrate 52 and surface light emitting laser 3 and bonds them together; a protruding portion 6, which is protruded and surrounds a periphery of the through hole TH from a principal surface opposite to the surface light emitting laser 3, the principal surface being one of principal surfaces of the substrate 52; an optical fiber 7 having one end portion inserted through the through hole TH; and an adhesive 8 which bonds the optical fiber 7 to the substrate 52.

Figure 12:
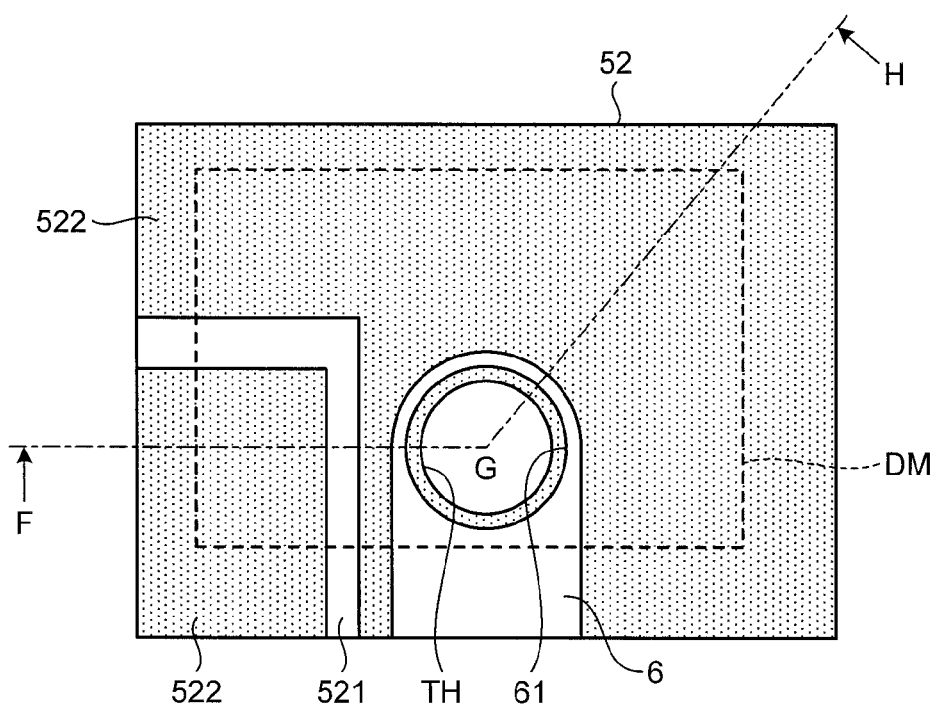
FIG. 12 is a diagram illustrating a configuration of one of principal surfaces of a substrate of the optical transmission unit according to the third embodiment of the present invention, the one of the principal surfaces of the substrate facing a surface light emitting laser.

FIG. 12 is a diagram illustrating a configuration of one of principal surfaces of the substrate 52, which faces the surface light emitting laser 3 (a top surface side of the substrate 52 in FIG. 11). An F-G-H line illustrated in FIG. 12 illustrates the cutting plane of FIG. 11. That is, FIG. 11 is a combined cross section diagram along the F-G-H line of FIG. 12. The substrate 52 has a base portion 521, which is plate shaped and has an insulating material as a base material, and a wiring layer 522, which is provided on a principal surface of the base portion 521. The wiring layer 522 is formed over substantially the entire surface of the principal surface of the base portion 521. Therefore, differently from the above described first embodiment, the protruding portion 6 is formed on the wiring layer 522.

According to the above described third embodiment of the present invention, similarly to the above described first embodiment, a bonding strength between a photoelectric conversion element (surface light emitting laser) and a substrate, on which the photoelectric conversion element is mounted, is able to be improved, and a decrease in optical coupling rate between the photoelectric conversion element and an optical fiber is able to be prevented. Further, a variation in the optical coupling rate between the photoelectric conversion element and optical fiber among respective products is also able to be suppressed.

Furthermore, according to the third embodiment, since the substrate and the surface light emitting laser are able to be electrically connected to each other by the wiring layer directly under the protruding portion, it is suitable for mounting a small sized photoelectric conversion element.

Figure 13:
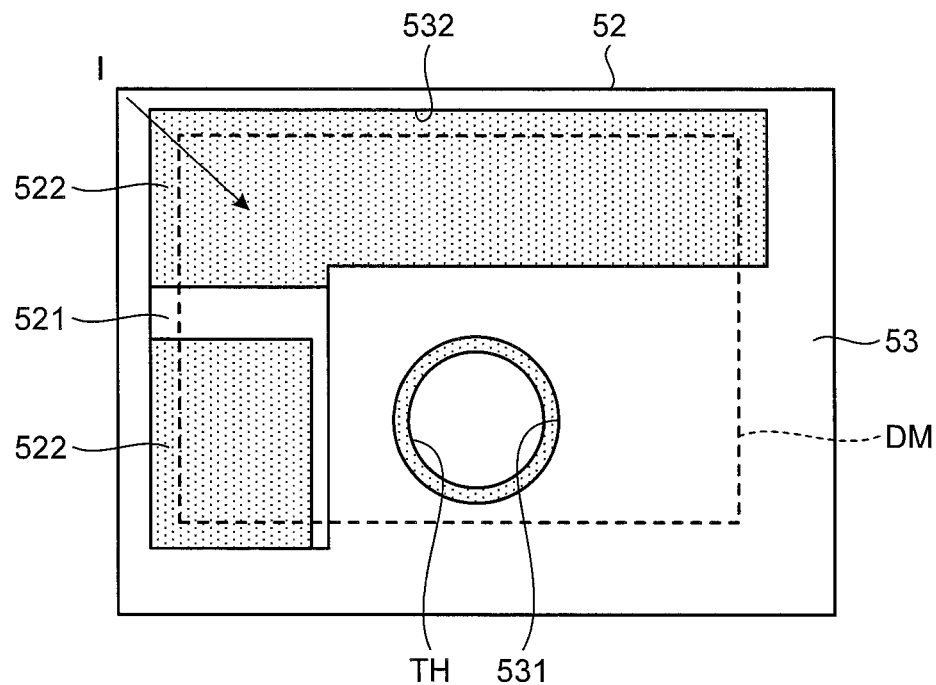
FIG. 13 is a diagram illustrating a configuration of a protruding portion of an optical transmission unit according to a modified example of the third embodiment of the present invention.

FIG. 13 is a diagram illustrating a configuration of a protruding portion of an optical transmission unit according to a modified example of the third embodiment, and is a diagram illustrating a configuration of one of principal surfaces of the substrate 52, which faces the surface light emitting laser 3. A protruding portion 53 has a hole portion 531 formed therein, the hole portion 531 having a central axis that matches that of the through hole TH and having a diameter larger than that of the through hole TH. In the protruding portion 53, a hollow portion 532 is formed. The hollow portion 532 exposes an approximately L-shaped region that includes a part of the mounting area DM. The approximately L-shaped region includes: two adjacent sides of four sides of a rectangle forming a boundary of the mounting area DM; and a region near the two adjacent sides. The protruding portion 53 covers, on the principal surface of the substrate 52, an area excluding portions respectively exposed by the hole portion 531 and the hollow portion 532. A size of the hollow portion 532 is set according to various conditions, such as a ratio thereof to an area of the mounting area DM, a type and an injection amount of the adhesive 5, and a required bonding strength.

A direction in which the adhesive 5 is injected when bonding the substrate 52 to the surface light emitting laser 3 is a direction approximately parallel to a straight line connecting a vertex of the mounting area DM with the center of the through hole TH from an end portion of the substrate 52. The end portion of the substrate 52 is near the vertex of the mounting area DM where the hollow portion 532 is provided. Specifically, in the case illustrated in FIG. 13, the adhesive 5 is injected from near a left upper end portion of the substrate 52 (in an arrow "I" direction in FIG. 13). The adhesive 5 injected as described above stays in the hollow portion 532 to bond the substrate 52 to the surface light emitting laser 3.

According to the modified example, the adhesive 5 is able to be infallibly prevented from flowing into the hole portion 531 and through hole TH and occurrence of a flaw, such as uneven adhesion, is able to be prevented. Further, the protruding portion 53 is able to be easily made by a resist pattern. Furthermore, just by adjusting the size of the hollow portion 532, the injection amount of the adhesive 5 is able to be adjusted easily.

Fourth Embodiment

Figure 14:
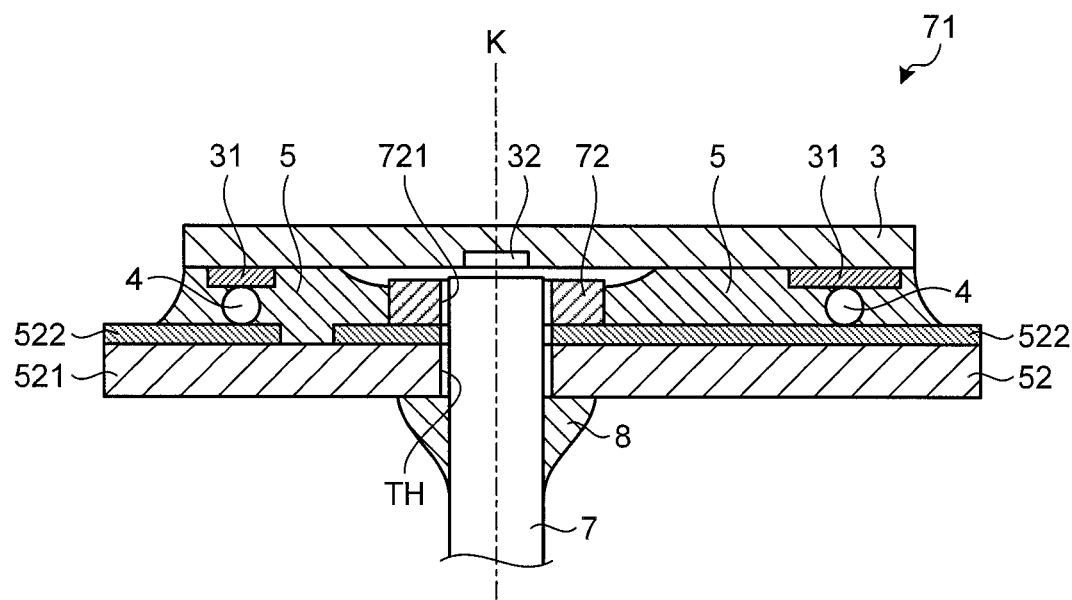
FIG. 14 is a cross section diagram illustrating a configuration of main parts of an optical transmission unit according to a fourth embodiment of the present invention.

FIG. 14 is a cross section diagram illustrating a configuration of main parts of an optical transmission unit according to a fourth embodiment of the present invention. In an optical transmission unit 71 illustrated in this figure, a configuration of a protruding portion thereof is different from that of the optical transmission unit 51 described in the third embodiment.

A protruding portion 72 of the optical transmission unit 71 communicates with the through hole TH and has a hole portion 721 formed therein, which penetrates in a thickness direction of the protruding portion 72. The hole portion 721 has a central axis, which matches that of the through hole TH, and has a diameter that is the same as the diameter of the through hole TH. A configuration of the protruding portion 72 other than the hole portion 721 is similar to that of the above described protruding portion 6.

Figure 15:
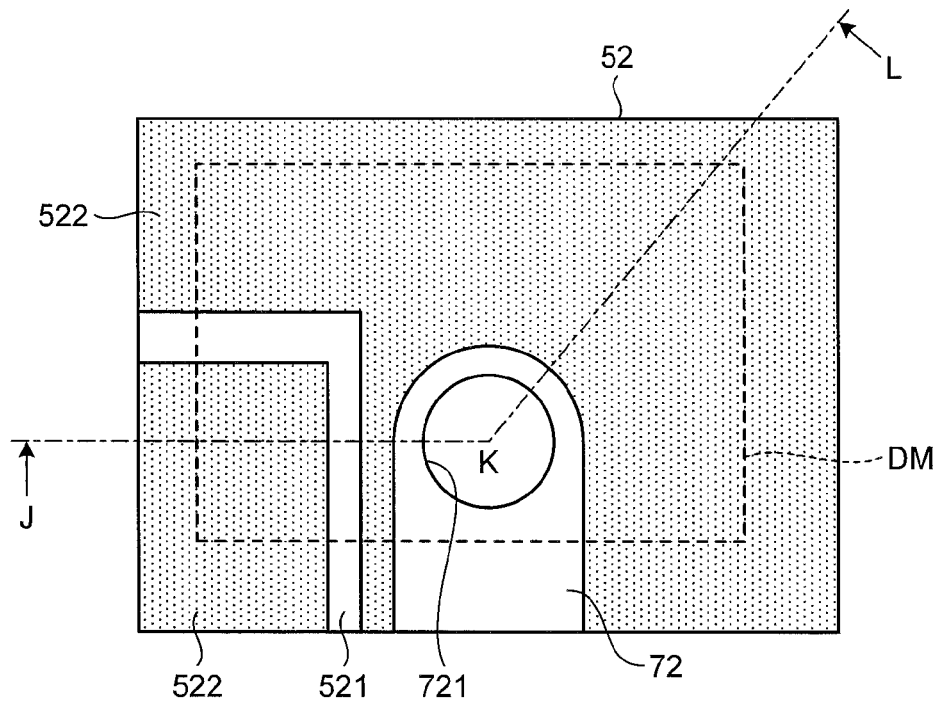
FIG. 15 is a diagram illustrating a configuration of one of principal surfaces of a substrate of the optical transmission unit according to the fourth embodiment of the present invention, the one of the principal surfaces of the substrate facing a surface light emitting laser.

FIG. 15 is a diagram illustrating a configuration of a principal surface of the substrate 52 at a side facing the surface light emitting laser 3 (a top surface side in FIG. 14), the principal surface being one of the principal surfaces of the substrate 52. A J-K-L line illustrate in FIG. 15 illustrates a cutting plane of FIG. 14. That is, FIG. 14 is a combined cross section diagram along the J-K-L line of FIG. 15. As illustrated in FIG. 15, when the substrate 52 is seen from a side at which the protruding portion 72 is provided, the wiring layer 522 is not visible inside the hole portion 721.

For the protruding portion 72 having the above configuration, the wiring layer 522 is formed in the base portion 521, and a base material of the protruding portion 72 is formed at a specified position of this wiring layer 522 by a resist. Thereafter, by a means, such as a drill, the hole portion 721 and through hole TH are formed at once.

According to the above described fourth embodiment of the present invention, similarly to the above described first embodiment, a bonding strength between a photoelectric conversion element (surface light emitting laser) and a substrate, on which the photoelectric conversion element is mounted, is able to be improved, and a decrease in optical coupling rate between the photoelectric conversion element and an optical fiber is able to be prevented. Further, a variation in the optical coupling rate between the photoelectric conversion element and optical fiber among respective products is able to be suppressed.

Furthermore, according to the fourth embodiment, similarly to the above described third embodiment, since the substrate and the surface light emitting laser are able to be electrically connected to each other by the wiring layer directly under the protruding portion, it is suitable for mounting a small sized photoelectric conversion element.

Moreover, according to the fourth embodiment, since inner diameters of the through hole of the substrate and hole portion of the protruding portion are the same, these are able to be formed at once and manufacture thereof is easy.

Fifth Embodiment

Figure 16:
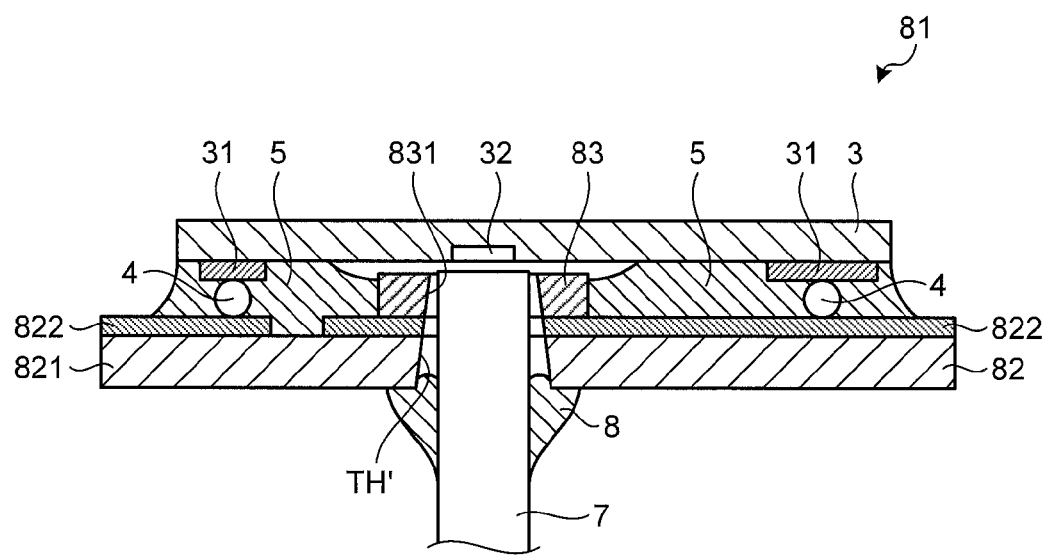
FIG. 16 is a cross section diagram illustrating a configuration of main parts of an optical transmission unit according to a fifth embodiment of the present invention.

FIG. 16 is a cross section diagram illustrating a configuration of main parts of an optical transmission unit according to a fifth embodiment of the present invention, and is a cross section diagram corresponding to FIG. 14 in the fourth embodiment. An optical transmission unit 81 illustrated in FIG. 16 includes: a substrate 82, which is plate shaped and has a through hole TH' formed therein and penetrating in a plate thickness direction; the surface light emitting laser 3 mounted on the substrate 82; the bump 4, which connects an electrode of the substrate 82 with the electrode of the surface light emitting laser 3; the adhesive 5 which is filled in a part of a region between the substrate 82 and the surface light emitting laser 3 and bonds them together; a protruding portion 83, which is protruded and surrounds a periphery of the through hole TH' from a principal surface opposite to the surface light emitting laser 3, the principal surface being one of principal surfaces of the substrate 82; the optical fiber 7 having one end portion that is inserted through the through hole TH'; and the adhesive 8 for bonding the optical fiber 7 to the substrate 82.

The substrate 82 has a base portion 821 which is plate shaped, and a wiring layer 822 which is provided on a principal surface of the base portion 821. The wiring layer 822 is formed over substantially the entire surface of the principal surface of the base portion 821. Accordingly, the protruding portion 83 is formed on the wiring layer 822.

In the protruding portion 83, a hole portion 831 is formed, which communicates with the through hole TH' and penetrates in a thickness direction of the protruding portion 83. Inner peripheral surfaces of the hole portion 831 and through hole TH' are smoothly continuous with each other along the thickness direction, and the hole portion 831 and through hole TH' form a tapered cross section with a diameter that gradually increases from the hole portion 831 side towards the through hole TH' side. A configuration of the protruding portion 83 other than the hole portion 831 is similar to that of the above described protruding portion.

When forming the protruding portion 83 having the above configuration, the wiring layer 822 is formed in the base portion 821 first, and a base material of the protruding portion 83 is formed at a specified position of this wiring layer 822 by a resist. Thereafter, by means, such as laser, the hole portion 831 and through hole TH' are formed at once. Thereby, the protruding portion 83 is formed.

According to the above described fifth embodiment of the present invention, similarly to the above described first embodiment, a bonding strength between a photoelectric conversion element (surface light emitting laser) and a substrate, on which the photoelectric conversion element is mounted, is able to be improved, and a decrease in optical coupling rate between the photoelectric conversion element and an optical fiber is able to be prevented. Further, a variation in the optical coupling rate between the photoelectric conversion element and optical fiber among respective products is able to be suppressed.

Moreover, according to the fifth embodiment, similarly to the above described fourth embodiment, since the through hole of the substrate and the hole portion of the protruding portion are able to be formed at once, manufacture thereof is easy.

Furthermore, according to the fifth embodiment, since a diameter of the through hole at a side from which the end face of the optical fiber is inserted first is a little larger than the diameter of the optical fiber, insertion of the optical fiber is easy.

Figure 17:
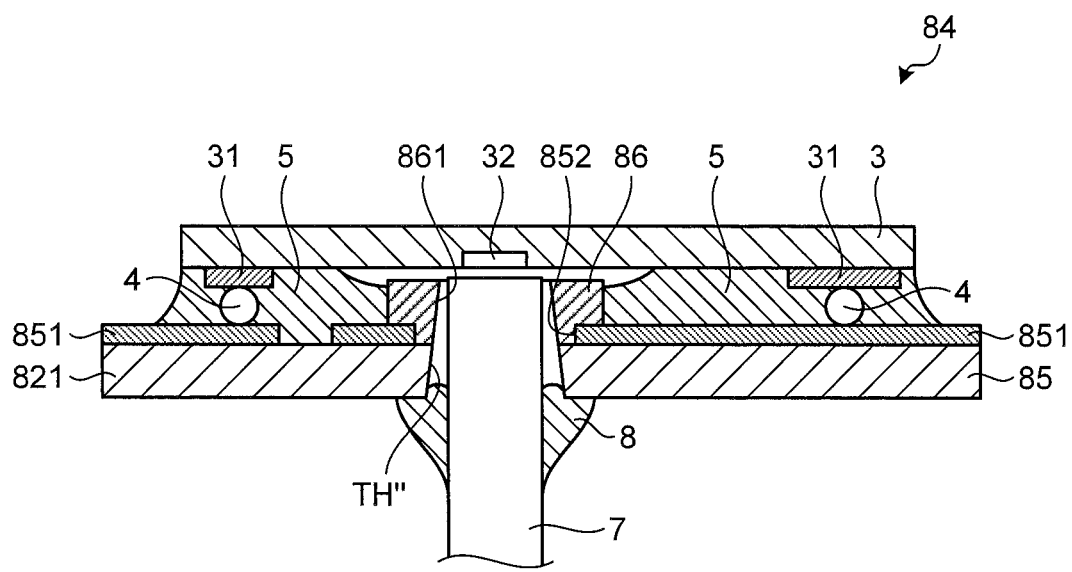
FIG. 17 is a cross section diagram illustrating a configuration of main parts of an optical transmission unit according to a modified example of the fifth embodiment of the present invention.

FIG. 17 is a cross section diagram illustrating a configuration of main parts of an optical transmission unit according to a modified example of the fifth embodiment. An optical transmission unit 84 illustrated in this figure includes: a substrate 85, which is plate shaped and has a through hole TH" formed therein and penetrating in a plate thickness direction thereof; the surface light emitting laser 3 that is mounted on the substrate 85; the bump 4 that connects an electrode of the substrate 85 with the electrode of the surface light emitting laser 3; the adhesive 5 which is filled in a part of a region between the substrate 85 and the surface light emitting laser 3 and bonds them together; a protruding portion 86, which is protruded and surrounds a periphery of the through hole TH" from a principal surface opposite to the surface light emitting laser 3, the principal surface being one of principal surfaces of the substrate 85; the optical fiber 7 having the one end portion that is inserted through the through hole TH"; and the adhesive 8 that bonds the optical fiber 7 to the substrate 85.

The substrate 85 has a base portion 821 which is plate shaped, and a wiring layer 851 which is provided on a principal surface of the base portion 821. In the base portion 821, the through hole TH" is formed. In the wiring layer 851, a hole portion 852, which is coaxial with the through hole TH" and has a diameter larger than that of the through hole TH", is formed.

In the protruding portion 86, a hole portion 861 is formed, which communicates with the through hole TH" and penetrates in a thickness direction of the protruding portion 86. The protruding portion 86 fills a stepped portion between the base portion 821 and wiring layer 851. Therefore, inner peripheral surfaces of the hole portion 861 and through hole TH" are smoothly continuous with each other along the thickness direction, and the hole portion 861 and through hole TH" form a tapered cross sectional shape with a diameter that gradually increases from the hole portion 861 side towards the through hole TH" side. The hole portion 861 and through hole TH" are formed at once by means such as laser, similarly to the fifth embodiment.

For the optical transmission unit 84 according to the above described modified example of the fifth embodiment, when the hole portion 861 and through hole TH" are formed at once, since the inner peripheral surface of the hole portion 852 of the wiring layer 851 does not constitute a part of the through hole TH", there is no risk that a metal, such as gold or copper, which forms the wiring layer 851, is scattered.

Other Embodiments

Thus far, modes for carrying out the present invention have been described, but the present invention is not to be limited only to the above described first to fifth embodiments. For example, in some embodiments, a protruding portion may be formed on a surface of a surface light emitting laser, the surface facing a substrate.

Further, the present invention is applicable to a photoelectric conversion module and an optical transmission unit, which include a photoelectric conversion element, such as a photodiode having a light receiving unit, instead of a surface light emitting laser.

Further, a region to be filled with an adhesive, which is filled in a region between a substrate and a photoelectric conversion element and bonds them together, just needs to be a region outside an inner peripheral surface of a hole portion of a protruding portion, and may reach a top end surface of the protruding portion.

According to some embodiments, a photoelectric conversion module includes: a protruding portion that has a hole portion communicating with a through hole of a substrate and protrudes from one of principal surfaces of one of the substrate and a photoelectric conversion element, one of the principal surfaces facing the other one of the substrate and the photoelectric conversion element; and an adhesive that is filled in a part of a region between the substrate and the photoelectric conversion element, the region being a region outside an inner edge of the protruding portion, in order to bond the substrate to the photoelectric conversion element. With this structure, the adhesive cannot be reached inside the through hole. Therefore, a bonding strength between the photoelectric conversion element and the substrate, on which the photoelectric conversion element is mounted, is able to be improved, and a decrease in optical coupling rate between the photoelectric conversion element and an optical fiber is able to be prevented.

The present invention is applicable, for example, to an electronic device, which has an imaging element having a large number of pixels, such as a medical or industrial endoscope or a digital camera, and for which high speed signal transmission is demanded.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photoelectric conversion module, comprising:
   a substrate having a wiring layer and a through hole;
   a photoelectric conversion element having a light emitting unit or light receiving unit and mounted on the substrate such that the light emitting unit or light receiving unit faces the through hole;
   a protruding portion that has a hole portion communicating with the through hole and protrudes from one of principal surfaces of one of the substrate and the photoelectric conversion element, the one of the principal surfaces facing the other one of the substrate and the photoelectric conversion element; and
   an adhesive that is filled in a part of a region between the substrate and the photoelectric conversion element, the region being a region outside an inner peripheral surface of the hole portion, in order to bond the substrate to the photoelectric conversion element, wherein
   the adhesive is filled by injection along a direction towards a center of the through hole from an end portion of the substrate,
   at least a part of an upstream portion of an outer edge of the protruding portion becomes gradually wider along the direction, the upstream portion being upstream of the center of the through hole in the direction, and a part of a downstream portion of the outer edge of the protruding portion is positioned outside a mounting area of the photoelectric conversion element projected on a principal surface of the substrate, the downstream portion being downstream of the center of the through hole in the direction; and
   the protruding portion is formed on the wiring layer.

2. The photoelectric conversion module according to claim 1, wherein the protruding portion has a hollow portion for exposing a part of the mounting area.

3. The photoelectric conversion module according to claim 2, wherein the protruding portion covers, on the principal surface of the substrate, an area excluding portions respectively exposed by the hole portion and the hollow portion.

4. The photoelectric conversion module according to claim 1, wherein the protruding portion abuts against a principal surface of the other one of the substrate and the photoelectric conversion element.

5. The photoelectric conversion module according to claim 1, wherein a diameter of the hole portion is equal to a diameter of the through hole.

6. The photoelectric conversion module according to claim 1, wherein inner peripheral surfaces of the hole portion and the through hole are smoothly continuous with each other, and the hole portion and the through hole have a tapered cross section having a diameter that gradually increases towards the through hole from the hole portion.

7. The photoelectric conversion module according to claim 1, wherein the protruding portion is formed by a resist.

8. An optical transmission unit, comprising:
   the photoelectric conversion module according to claim 1; and
   an optical fiber with one of end faces thereof facing the light emitting unit or the light receiving unit in a three dimensional region including the through hole and extending along a central axis of the through hole.

* * * * *